US011053583B2

(12) United States Patent
Couillard et al.

(10) Patent No.: US 11,053,583 B2
(45) Date of Patent: Jul. 6, 2021

(54) PARTICLE REDUCTION DURING SPUTTERING DEPOSITION

(71) Applicant: CORNING INCORPORATED, Corning, NY (US)

(72) Inventors: James Gregory Couillard, Ithaca, NY (US); Ming-Huang Huang, Ithaca, NY (US)

(73) Assignees: CORNING INCORPORATED, Corning, NY (US); VIEW, INC., Milpitas, CA (US)

( * ) Notice: Subject to any disclaimer, the term of this patent is extended or adjusted under 35 U.S.C. 154(b) by 129 days.

(21) Appl. No.: 16/348,708

(22) PCT Filed: Nov. 9, 2017

(86) PCT No.: PCT/US2017/060811
§ 371 (c)(1),
(2) Date: May 9, 2019

(87) PCT Pub. No.: WO2018/089604
PCT Pub. Date: May 17, 2018

(65) Prior Publication Data
US 2019/0284681 A1 Sep. 19, 2019

Related U.S. Application Data

(60) Provisional application No. 62/420,127, filed on Nov. 10, 2016.

(51) Int. Cl.
*C23C 14/50* (2006.01)
*C03C 17/00* (2006.01)
(Continued)

(52) U.S. Cl.
CPC ............ *C23C 14/50* (2013.01); *C03C 17/002* (2013.01); *C23C 14/564* (2013.01);
(Continued)

(58) Field of Classification Search
CPC ............ C03C 17/002; C03C 2218/151; C03C 2218/154; H01L 21/6715; H01L 21/68785; C23C 14/50; C23C 14/564
See application file for complete search history.

(56) References Cited

U.S. PATENT DOCUMENTS

| 4,996,078 A | 2/1991 | Langowski |
| 5,738,767 A | 4/1998 | Coad et al. |

(Continued)

FOREIGN PATENT DOCUMENTS

| CN | 202070189 U | 12/2011 | |
| CN | 202430282 | * 9/2012 | ............ C23C 14/50 |

(Continued)

OTHER PUBLICATIONS

International Search Report and Written Opinion of the International Searching Authority; PCT/US2017/060811 dated Feb. 9, 2018, 10 Pages; European Patent Office.

(Continued)

*Primary Examiner* — Yuechuan Yu

(57) ABSTRACT

Described herein are apparatuses and methods for holding a substrate in a position that minimizes particle contamination of the substrate when the substrate is being coated. Along with the apparatus, processes for reducing particle reduction on substrates are provided. The articles and processes described herein are useful in making coated glass substrates, such as used in electrochromic, photochromic, or photovoltaic technologies.

10 Claims, 5 Drawing Sheets

(51) Int. Cl.
  *C23C 14/56* (2006.01)
  *H01L 21/67* (2006.01)
  *H01L 21/687* (2006.01)

(52) U.S. Cl.
  CPC .... *H01L 21/6715* (2013.01); *H01L 21/68785* (2013.01); *C03C 2218/151* (2013.01); *C03C 2218/154* (2013.01)

(56) References Cited

U.S. PATENT DOCUMENTS

| | | |
|---|---|---|
| 6,334,404 B1 | 1/2002 | Liu et al. |
| 2003/0036216 A1 | 2/2003 | Suezaki et al. |
| 2010/0163406 A1 | 7/2010 | Le et al. |
| 2016/0215384 A1 | 7/2016 | Jeong |

FOREIGN PATENT DOCUMENTS

| | | |
|---|---|---|
| CN | 202430282 U | 9/2012 |
| CN | 203728922 U | 7/2014 |
| CN | 208136329 U | 11/2018 |
| DE | 102009038369 A1 | 3/2011 |
| JP | 2006225748 A | 8/2006 |

OTHER PUBLICATIONS

Blanche et al; "Relationships Between In-Flight Particle Characteristics and Coating Microstructure With a Twin Wire Arc Spray Process and Different Working Conditions"; Surface and Coatings Technology, 182 (2004) pp. 215-226.

Chinese Patent Application No. 201780083045.1, Office Action dated Jan. 5, 2021, 7 pages. (English Translation Only); Chinese Patent Office.

* cited by examiner

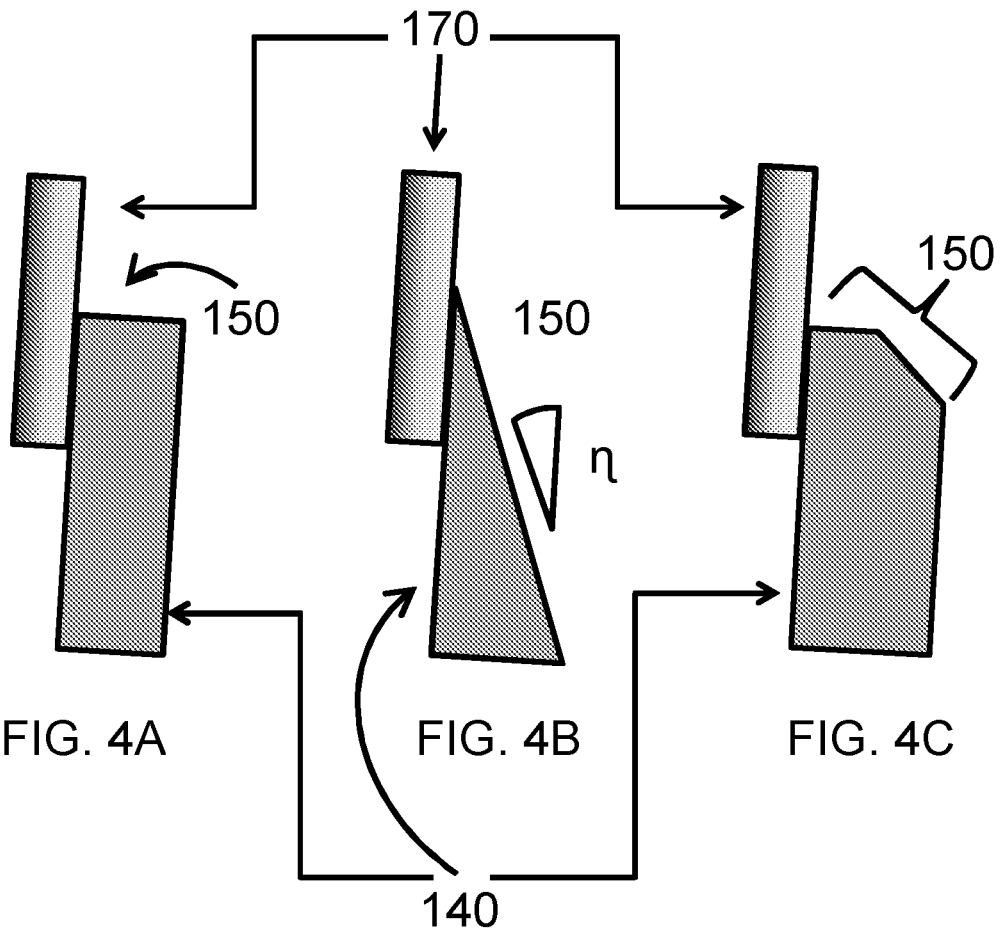

PARTICLE REDUCTION DURING SPUTTERING DEPOSITION

This application claims the benefit of priority under 35 U.S.C. § 371 of International Application No. PCT/US2017/060811 filed on Nov. 9, 2017, which claims the benefit of priority under 35 U.S.C. § 119 of U.S. Provisional Application Ser. No. 62/420,127, filed on Nov. 10, 2016, the content both of which are relied upon and incorporated herein by reference in their entirety.

BACKGROUND

Field

Described herein are apparatuses and methods for holding a substrate in a position that minimizes particle contamination of the substrate when the substrate is being coated. Along with the apparatus, processes for reducing particle reduction on substrates are provided. More specifically, described herein apparatuses for mechanically minimizing particle contamination of coated glass substrates, along with methods for minimizing particle contamination on coated glass substrates, and uses thereof.

Technical Background

Many applications involve coating substrates with thin films. For example, thin films for photovoltaic or electrochromic applications can be coated onto glass substrates. In many cases, the films are deposited onto the substrate under vacuum by physical vapor deposition (PVD), also known as sputter deposition. In PVD, a vapor of the material is produced, which is then deposited on the object which requires coating. PVD is advantageous in that it can provide a durable coating of many inorganic materials. However, because it is a vapor phase process, material is deposited on all parts within the chamber, which can lead to accumulation of particulate or unadhered material in the chamber and on substrate carriers. During deposition it is desirable to reduce non-vapor phase particles being incorporated into the film, as these can lead to defects in the finished device. The present disclosure describes modifications to the substrate carrier used in the deposition process to further reduce particle contamination.

SUMMARY

Described herein are articles for holding large substrates in approximately vertical configurations. Such articles are designed to be used in coating devices and deposition processes and allow the substrates to be efficiently and evenly coated while preventing or minimizing contamination of the surface by extraneous particles that coat or are deposited in the coating chamber.

In an aspect (1), the disclosure provides an article comprising a carrier for holding a substrate in an approximately vertical configuration, the substrate having at least a front face, a back face, a top, a bottom and two edges, the carrier comprising a frame that is dimensionally larger than the substrate, the frame comprising a top section comprising at least one edge and positioned to contact, or indirectly or directly support at least part of the top edge, the front face or the back face of the substrate; wherein the top section comprises one or more collection trays, the one or more collection trays comprise a finned object having a length, a width, and a thickness, that protrudes from the top section at an angle $\theta$ of from about 20° to about 160° relative to the top section, and wherein the length of the finned object spans at least part of the length of the top section and is approximately parallel to the at least one edge of the top section; a bottom section approximately parallel to the top section, the bottom section comprising at least one edge and positioned to contact, or indirectly or directly support at least part of the bottom edge, the front face or the back face of the substrate; two, lateral sections approximately parallel to each other and approximately orthogonal to the top and bottom sections, each lateral section comprising at least one edge and positioned to contact, or indirectly or directly support at least part of one of the lateral edges, or the front face or the back face of the substrate; and one or more clamping mechanisms for fixing the glass to at least one of the top, bottom, or lateral sections; wherein the carrier is designed so that when a substrate is in the carrier, the substrate is held at an angle $\varphi$ of from greater than 0° to about 10° forward tilt.

In an aspect (2), the disclosure provides the article of aspect (1), wherein the substrate is held at an angle $\varphi$ of from greater than about 1° to about 5° forward tilt. In an aspect (3), the disclosure provides the article of aspect (1) or aspect (2), wherein the finned object protrudes from the top section at an angle $\theta$ of from about 40° to about 170° relative to the top section. In an aspect (4), the disclosure provides the article of any of aspects (1)-(3), wherein the angle of the finned object relative to the top section changes from the initial angle $\theta$ to a final angle, $\psi$. In an aspect (5), the disclosure provides the article of aspect (4), wherein the change in angle is due to a curve or a bend and is the difference between $\theta$ and $\psi$ is greater than 60°. In an aspect (6), the disclosure provides the article of any of aspects (1)-(5), wherein the top section of the frame is in front of the front face of the substrate and has a tilt, $\omega$, of from −10° to 10°. In an aspect (7), the disclosure provides the article of any of aspects (1)-(6), wherein the top section of the frame is behind of the front face of the substrate and has a forward tilt, $\omega$, of from −10° to 10°. In an aspect (8), the disclosure provides the article of any of aspects (1)-(7), wherein the frame further comprises one or more electrolytic coating layers. In an aspect (9), the disclosure provides the article of aspect (8), wherein the electrolytic coating layer comprises copper, chromium, titanium, nickel, or combinations or oxides thereof. In an aspect (10), the disclosure provides the article of any of aspects (1)-(9), wherein at least part of the carrier has an average surface roughness, Ra, of from 1 µm to 100 µm.

In an aspect (11), the disclosure provides a method of coating a substrate comprising: placing the substrate in the article of any of aspects (1)-(10); and subjecting the substrate to a thin-film coating process. In an aspect (12), the disclosure provides the method of aspect (11), wherein the thin film coating process comprises chemical vapor deposition, sputtering deposition, electron beam deposition, pulsed laser deposition, molecular beam epitaxy, or ion beam deposition. In an aspect (13), the disclosure provides the method of aspect (11) or aspect (12), wherein the substrate is held at an angle $\varphi$ of from greater than about 1° to about 5° forward tilt. In an aspect (14), the disclosure provides the method of any of aspects (11)-(13), wherein the finned object protrudes from the top section at an angle $\theta$ of from about 40° to about 140° relative to the top section. In an aspect (15), the disclosure provides the method of any of aspects (11)-(14), wherein the angle of the finned object relative to the top section changes from the initial angle $\theta$ to a final angle, $\psi$. In an aspect (16), the disclosure provides the method of aspect (16), wherein the change in angle is due to a curve or a bend and is the difference between θ and ψ is greater than 60°. In an aspect (17), the disclosure provides the method of any of aspects (11)-(16), wherein the top section of the frame is in front of the front face of the substrate and has a tilt, ω, of from −10° to 10°. In an aspect (18), the disclosure provides the method of any of aspects (11)-(17), wherein the top section of the frame is behind of the front face of the substrate and has a forward tilt, ω, of from −10° to 10°. In an aspect (19), the disclosure provides the method of any of aspects (11)-(18), wherein the frame further comprises one or more electrolytic coating layers. In an aspect (20), the disclosure provides the method of aspect (19), wherein the electrolytic coating layer comprises copper, chromium, titanium, nickel, or combinations or oxides thereof.

Additional features and advantages will be set forth in the detailed description which follows, and in part will be readily apparent to those skilled in the art from the description or recognized by practicing the embodiments as described in the written description and claims hereof, as well as in the appended drawings.

It is to be understood that both the foregoing general description and the following detailed description are merely exemplary, and are intended to provide an overview or framework for understanding the nature and character of the invention.

BRIEF DESCRIPTION OF THE DRAWINGS

The accompanying drawings are included to provide a further understanding of the description, and are incorporated in and constitute a part of this specification. The drawings are not necessarily to scale, and sizes of various elements may be distorted for clarity. The drawings illustrate one or more embodiment(s) and together with the description serve to explain the principles and operation of the embodiments.

FIGS. 4A-D provide a variety of designs for the bottom section, 140, of the frame. The bottom section, 140, can have an edge, 150, that has any number of shapes, such as those shown, which may reduce contamination or particle accumulation at the base of the sheet, 170.

DETAILED DESCRIPTION

Figure 1:
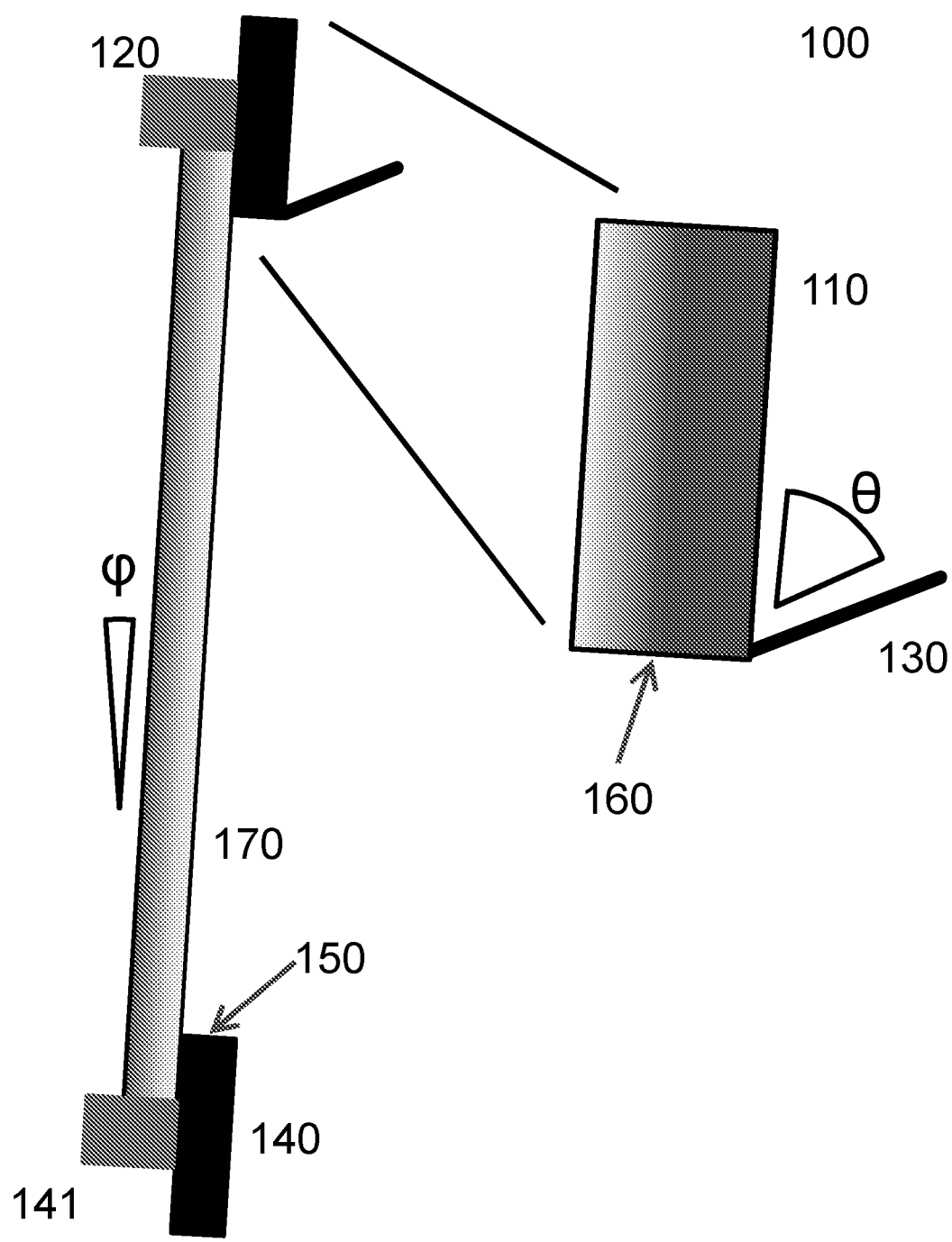
FIG. 1 is a cross-section of a carrier, 100, used to hold a substrate, 170, at an angle, φ, during sputter deposition. The substrate, 170, is vulnerable to particles raining down from the exposed carrier area above. A collection tray, 130, has been installed at an angle, θ, below the exposed top section, 110, to catch any falling particles.

Before the present materials, articles, and/or methods are disclosed and described, it is to be understood that the aspects described below are not limited to specific compounds, synthetic methods, or uses as such may, of course, vary. It is also to be understood that the terminology used herein is for the purpose of describing particular aspects only and is not intended to be limiting.

In this specification and in the claims that follow, reference will be made to a number of terms that shall be defined to have the following meanings:

Throughout this specification, unless the context requires otherwise, the word "comprise," or variations such as "comprises" or "comprising," will be understood to imply the inclusion of a stated integer or step or group of integers or steps but not the exclusion of any other integer or step or group of integers or steps.

It must be noted that, as used in the specification and the appended claims, the singular forms "a," "an" and "the" include plural referents unless the context clearly dictates otherwise. Thus, for example, reference to "a carrier" includes mixtures of two or more such carriers, and the like.

"Optional" or "optionally" means that the subsequently described event or circumstance may or cannot occur, and that the description includes instances where the event or circumstance occurs and instances where it does not.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed.

When the term "about" is used in describing a value or an end-point of a range, the disclosure should be understood to include the specific value or end-point referred to. When a numerical value or end-point of a range does not recite "about," the numerical value or end-point of a range is intended to include two embodiments: one modified by "about," and one not modified by "about." It will be further understood that the endpoints of each of the ranges are significant both in relation to the other endpoint, and independently of the other endpoint.

Disclosed are articles and components that may be used for, may be used in conjunction with, may be used in preparation of, or are products of the disclosure. It should be understood that when combinations, subsets, interactions, groups, etc. of these materials are disclosed that while specific reference of each various individual and collective combinations and permutation of these compounds may not be explicitly disclosed, each may be specifically contemplated and described herein. Thus, if a class of molecules A, B, and C are disclosed as well as a class of molecules D, E, and F and an example of a combination molecule, A-D may be disclosed, then even if each is not individually recited, each may be individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these may be also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that may be performed it may be understood that each of these additional steps may be performed with any specific embodiment or combination of embodiments of the disclosed methods, and that each such combination may be specifically contemplated and should be considered disclosed.

Many applications involve thin film coatings on glass. One particular application is electrochromic films, such as those used for smart windows. These films produce a tinting effect when a voltage is applied across them. This condition has the effect of reducing light transmission and heat transmission for the window. The film stack is deposited onto the substrate (e.g., glass) under vacuum by physical vapor deposition (PVD), also known as sputter deposition. During deposition the film will also coat exposed surfaces of the deposition chamber and fixtures used to hold the substrate. Over time the accumulated film can flake off or generate particles. It is desirable to minimize or eliminate particles being incorporated into the film, as these can lead to electrical short defects in the finished device. In some cases, use of a forward tilt on the substrate during deposition may help to reduce particle contamination. However, tilt alone may not be sufficient to eliminate particle contamination. The current disclosure describes modifications to substrate carriers used in the deposition process to further reduce particle contamination.

As noted above, one method of minimizing particulate contamination is to tilt the substrate. In the case of a thick, rigid substrate, such as a thick (2 mm or greater) soda lime glass substrate, it is possible to tilt it quite significantly without inducing out-of-plane sag. However, with the drive towards thinner and lighter materials and devices, there is an increased interest in thinner, and sometimes flexible, substrates. In these cases, out-of-plane sag is a real concern because it can have a negative impact on deposition uniformity. The impact of sag becomes more pronounced as the substrate grows larger and thinner.

In order to minimize the impact of sag on substrates of any thickness, the necessary tilt to minimize particle deposition has been calculated using a simple collision model. Consider a particle which becomes dislodged within the vacuum chamber and begins falling due to gravity. As the particle passes through the stream of atoms being deposited onto the glass it may undergo momentum transfer due to an elastic collision with an incoming atom. Let $m_1$ be the mass of the incident atom and $m_2$ the mass of the particle. Conservation of momentum and energy give:

$$m_1 u_1 + m_2 u_2 \text{(before collision)} = m_1 v_1 + m_2 v_2 \text{(after collision)}$$

$$1/2 m_1 u_1^2 + 1/2 m_2 u_2^2 = 1/2 m_1 v_1^2 - 1/2 m_2 v_2^2$$

Assuming the falling particle has no initial forward motion ($u_2 = 0$) this can be simplified to:

$$m_2 v_2 = \frac{2 m_1 m_2 u_1}{m_1 + m_2}$$

The bombardment (forward) force on the particle is thus:

$$F_B = \left( \frac{2 m_1 m_2 u_1}{m_1 + m_2} \right) v$$

where v is the collision frequency. After the collision the angle of the particle's trajectory with respect to vertical is the ratio of the bombardment force to the gravitational force, or:

$$\theta = \operatorname{atan}\left[ \frac{F_B}{F_G} \right] = \operatorname{atan}\left[ \frac{2 m_1 u_1 v}{g(m_1 + m_2)} \right].$$

Using reasonable values for the input parameters (5 μm ITO particle, W atoms moving at 250 m/s, and a collision frequency based on 2 nm/s tungsten deposition rate) we arrive at a trajectory angle of ~3°. However it has been found that tilt alone is not sufficient to eliminate particle contamination. We can further reduce particle contamination by preventing the particles from becoming dislodged within the vacuum chamber in the first place.

One way to reduce particles is by modifying the carrier used to hold the substrate in the deposition system. Looking at FIG. 1, the substrate, 170, is potentially vulnerable to particles raining down from the top section of the frame, 110. The carrier, 100, surrounding the substrate, 170, is necessary both to hold the substrate, 170, securely, and also to minimize overspray of the deposited film onto the interior walls of the deposition chamber and rear face of the substrate, 170. The carrier, 100, in FIG. 1 has been modified to reduce the number of particles that fall from the top section of the frame, 110, and in the case of particles that do fall, ensure that they are far enough from the substrate that they are unlikely to impact it. Carrier, 100, incorporates a collection tray, 130, below the top section, 110, to catch falling particles.

FIG. 1 is a cross-section of a carrier, 100, holding a substrate, 170. The carrier, 100, includes a frame, 200 (shown in FIG. 2), and at least one or more clamping mechanisms, 120 and 141, for fixing and positioning the substrate, 170, such that it may be coated at the proper angle to minimize contamination. The carrier, 100, is designed to hold the substrate, 170, at an angle, φ (lower case phi), wherein φ is the angle difference between vertical (0°) and the angle of the downward tilt of the front face of the substrate. This tilt minimizes the possibility of airborne particles contacting and adhering to the substrate. φ should be sufficiently large enough to prevent any particles falling from the PVD chamber or top section, 110, of the frame from contacting the substrate, 170, but not so large that it induces a detrimental sag in the substrate, 170. In some embodiments, φ is from >0° to 10°, >0° to 8°, >0° to 5°, 1° to 8°, 1° to 5°, or 1° to 3°. The carrier, 100, may further include wheels, pulleys, tracks or other mechanisms or parts for moving the carrier from one region of a coater to another, or into or out of the coater. Additional carrier parts may include mechanisms for positioning the carrier, loading and unloading the substrate from the carrier, cleaning the carrier, and the like.

Figure 2:
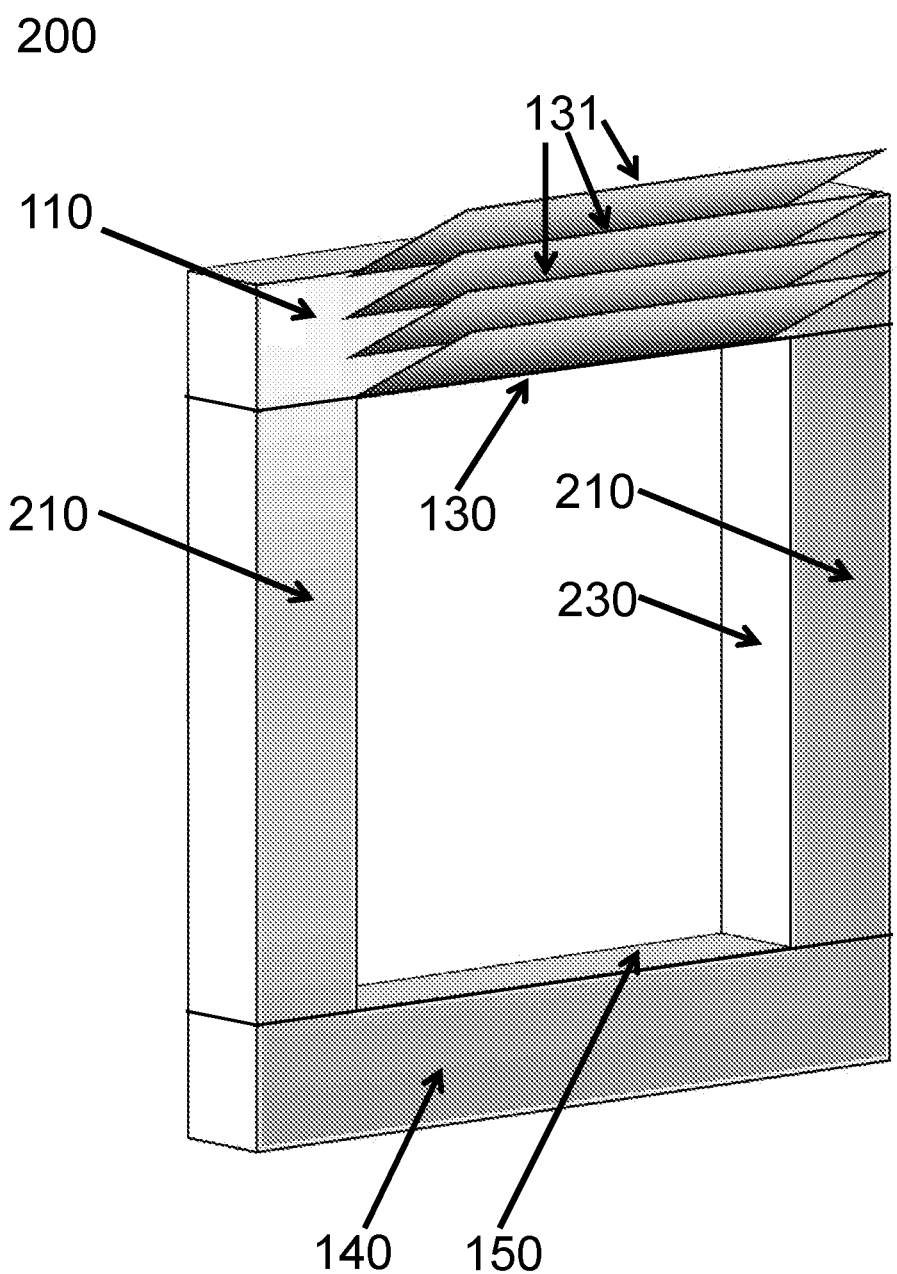
FIG. 2 is an alternative view of the frame, 200, from the front, wherein the top, 110, bottom, 140, and lateral 210, 220, sections are all shown in combination with multiple collection trays, 130, 131.

Referencing FIG. 2, the frame, 200, includes a top section, 110, a bottom section, 140, and two lateral sections, 210. In some embodiments, the frame comprises a single piece of material and the top, bottom and lateral sections are simply for descriptive purposes. Where the sections are independent of each other, they may be fastened via any known fastener type, including bolts, welding, clamps, etc. In some embodiments, the top section has an interior edge, 160 (as shown in FIG. 1), the bottom section has an interior edge, 150, and/or the lateral sections have interior edges, 230. Attached to the top section of the frame is the collection tray, 130. Additional collection trays, 131, may also be present.

Due to the high temperatures usually used in PVD coating processes, the carrier 100 and frame 200 can be made from a metal, a glass, or a ceramic. In some embodiments, the carrier 100 and frame 200 comprise a metal. The metal may comprise aluminum, steel, such as stainless steel, titanium, or alloys or mixtures comprising these materials.

FIG. 2 shows an embodiment having collection trays 130 and 131. The collection trays 130, 131 are shown having a width approximately equal to the interior opening of the frame 200. However, the collection trays 130, 131 may be narrower or deeper (extend farther out from the frame), and may not all be of equivalent width—for example, collection tray 130 may be wider than collection trays 131, or vice versa. The amount that the collection tray 130 extends from the top section 110 can be constant or varied, for example being longer in the center and shorter near the lateral edges, and can depend on a number of factors, including $\theta$ (described below), the amount of room in the chamber, and the amount of material being deposited. As in the case of the carrier 100 and the frame 200, the collection tray(s) 130, 131 should be made of a material capable of undergoing the temperatures and processes used in PVD. In some embodiments, the collection tray(s) 130, 131 can be made from a metal, a glass, or a ceramic. In some embodiments, the collection tray(s) 130, 131 comprise a metal. The metal may comprise aluminum, steel, such as stainless steel, titanium, or alloys or mixtures comprising these materials.

Figure 3A:
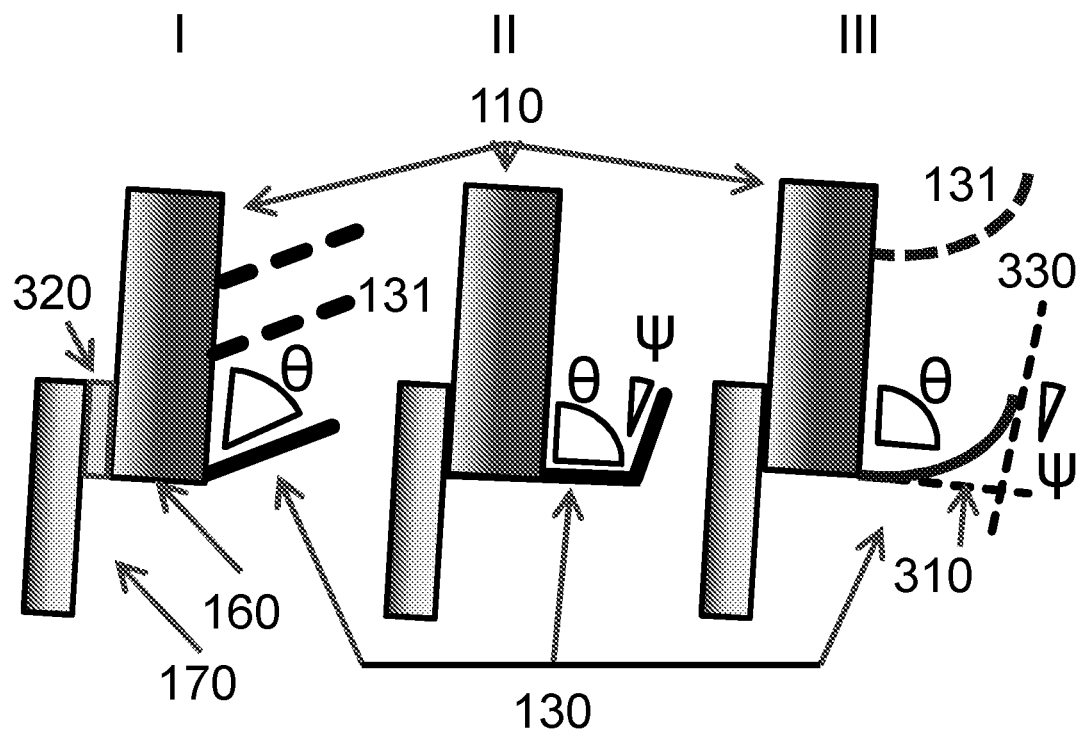
FIG. 3A provides alternative collection tray, 130, designs. The number of collection trays may be greater than one, with additional trays, 131, placed above the first tray, 130, to help catch additional particles.

Returning to FIG. 1 and referencing FIG. 3A, the collection tray 130 extends out from the top section 110 at an angle theta, $\theta$. In some embodiments, $\theta$ is from 20° to 160°, 30° to 150°, 40° to 140°, 50° to 130°, 60° to 120°, 70° to 110°, 80° to 100°, 60° to 90°, or 50° to 90°. The angle $\theta$ is chosen so as to minimize the direct exposure of the collection tray(s) 130, 131 to the material being deposited, minimize visibility of the substrate 170 to the exposed faces of the collection trays, and maximize capture of particles from above. The collection tray(s) 130, 131 (collection trays 131 shown as dotted lines due to being optional) can have any number of shapes that are constant or varying. FIG. 3A shows three examples where the collection tray(s) 130, 131 extend linearly away from the top section 110 (example I), make a bend some distance away from the top section 110 to create a trough (example II), and bend in a curving fashion to create a trough-like region (example III). In any of these cases, $\theta$ is determined by the initial angle between the collection tray 130, 131 and the top section 110 adjacent the collection tray 130, 131. For example, in the case of a rounded or gradual change in the collection tray, such as example III of FIG. 3A, $\theta$ would be determined by taking the tangent of the curve, 310, at the contact point between the collection tray and the top section 110. The final angle, $\psi$, of the collection tray is found by comparing the final angle of collection tray (or a tangent to the final angle, 330) with the angle of the surface of the top section at the contact point of the collection tray. In some embodiments, the difference between $\theta$ and $\psi$ provides a mechanism to describe the trough, channel or groove provided by the collection tray 130. In some embodiments, the difference between $\theta$ and $\psi$ is from >0° to 160, >0° to 150°, >0° to 140°, >0° to 130°, >0° to 120°, >0° to 100°, >0° to 90°, >0° to 80°, >0° to 70°, >0° to 60°, >0° to 50°, >0° to 40°, >0° to 30°, >0° to 20°, 20° to 140°, 40° to 120°, 50° to 100°, 60° to 150°, 60° to 140°, 60° to 120°, 80° to 150°, 80° to 140°, or 80° to 120°.

Figure 3B:
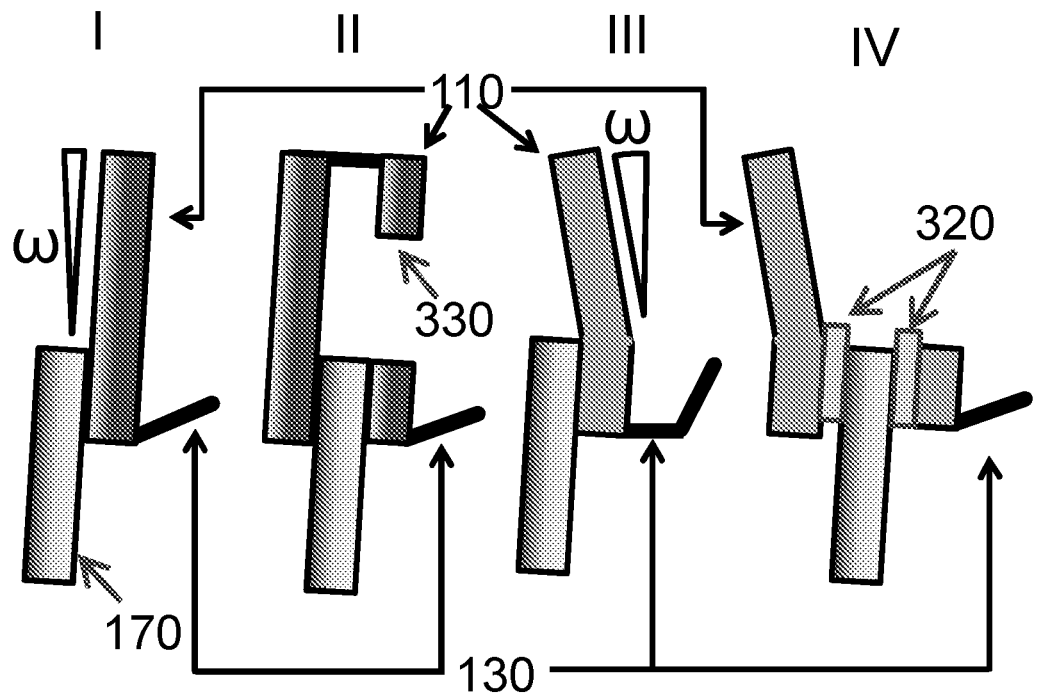
FIG. 3B shows alternative designs for the top section, 110, of the frame, where it can be designed to sit at an angle the same or different from the substrate and further, be placed primarily behind or in front of the substrate.

In some embodiments, the frame 200 and the substrate 170 do not directly contact, but are separated by an intermediate support, 320 (shown with regard to the top section of the frame, 110 in FIGS. 3A and 3B, but applicable to all sections of the frame 200). The intermediate support 320 may comprise polymers, e.g., Teflon, mica, metal, e.g., metal springs, carbon, such as graphite, etc. The desired properties of the intermediate support 320 are that these materials prevent frictive damage or point contact to the substrate by the frame, hold the substrate in a relatively fixed position while reducing stress by allowing for differences in thermal expansion and vibration, and are compatible with the process temperatures and vacuum conditions.

Importantly, the collection trays 130, 131 will still be coated during deposition. As the coating builds up over time this may still present a possible source of particle contamination. If the collection trays 130, 131 are properly arranged, meaning $\theta$ is acute enough that the collection tray forms some sort of trough, channel, or groove (e.g., as in FIG. 1 and FIG. 3A), the film will accumulate in the formed trough or groove. Under such circumstances, the lower surfaces, such as the bottom edge 160 of the top section 110, which face the glass, remain relatively free of deposited film and so represent less of a source of particles. Furthermore, any particles which are generated on the upper surfaces due to the accumulated film must move laterally in the direction away from the glass surface before they can fall downwards. Additionally, as shown in Examples II and III of FIG. 3A, the collection tray 130 may be further modified to increase particle retention by increasing the volume of the space in the collection tray or making the angle of the front edge of the collection tray greater, thus making it harder for accumulated particles to escape.

FIG. 3B presents a number of optional and/or alternative designs for the top section which can reduce particle contamination. In examples I and III of FIG. 3B, the top section is in front of and covers the upper edge of the substrate. Alternatively, as shown in examples II and IV, the top section may comprise a design where much of the top section is behind the substrate and/or the top section brackets the substrate (example 4 incorporates optional intermediate supports 320. The top section can be parallel to the substrate or part or all of it may be at an angle different from the substrate. As shown in the examples, at least part of the top section is at an angle $\omega$, where $\omega$ is relative to vertical and can be positive (tilted forward) or negative (tilted backward). In some embodiments, part or all of the top section can be tilted backward at an angle $\omega$, as shown in examples III and IV. In some embodiments, $\omega$ is from −30° to 30°, −20° to 20°, −15° to 15°, −10° to 10°, −5° to 5°, 0° to 10°, 0° to 5°, or −5° to 0°. By tilting the top section backwards, any accumulated particles will either be retained on the top section or are more likely to fall into the collection tray. Example 4 has the top section behind the plane of the glass, so that particles from this region will rain down on the top of the glass, or possibly on the backside, rather than the surface. In some embodiments, additional elements may be added to reduce airborne particulates. For instance, example 2 provides a flow barrier 330 that prevents or minimizes particle flow away from the top section.

Now moving to the bottom section 140 of the frame 110, which provides another possible place for particle accumulation. Because the bottom section is below the substrate 170, there is a much smaller likelihood that particles accumulated there will cause substrate contamination problems.

In some embodiments, the top edge 150 is at an approximate right angle to the substrate (FIG. 4A). However, in some embodiments, it is advantageous to minimize the possibility that particles will accumulate near the substrate by modifying the top edge 150 of the bottom section 140. In some embodiments, as shown in FIG. 4B, the top edge 150 is closer to vertical or at an angle such that any particles that contact it will be shed or fall off. In such embodiments, the top edge 150 has an angle, η, of from −90° to 30°, −90° to 20°, −90° to 30°, −90° to 10°, −80° to 30°, −80° to 10°, −70° to 30°, −70° to 10°, −60° to 30°, −60° to 10°, −45° to 45°, −30° to 30°, −25° to 25°, −20° to 20°, −15° to 15°, −10° to 10°, or −5° to 5°, relative to vertical. Alternatively, as shown in FIG. 4C, the top edge 150 may have a combination of multiple angles or shapes that minimize the accumulation of particles near the substrate, or as shown in FIG. 4D, the top edge may comprise a fillet edge.

Figure 5:
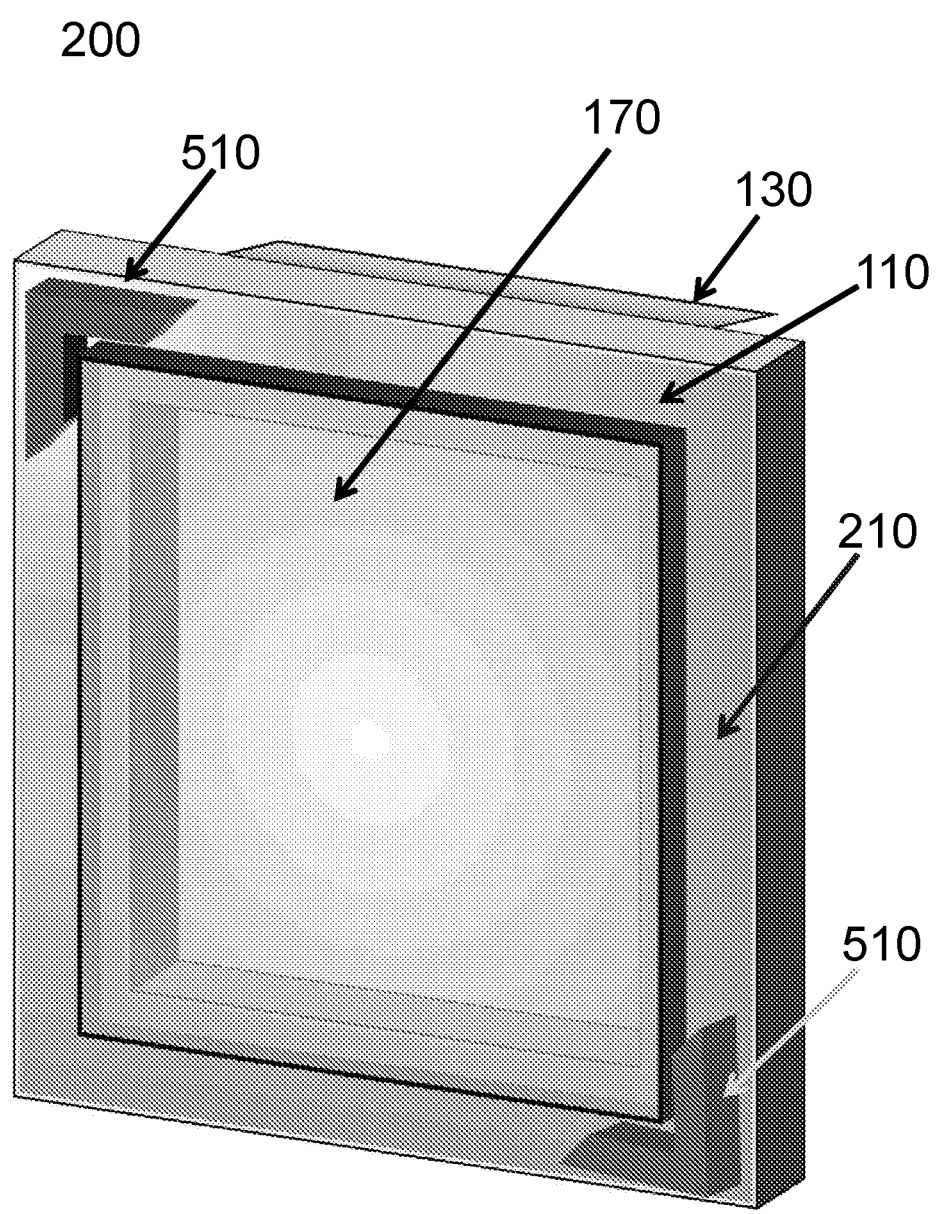
FIG. 5 is an alternative view of the frame, 200, from the back side, wherein the substrate, 170, is shown placed behind the frame, 200, and secured with two clamping mechanisms, 510.

FIGS. 2 and 5 show the lateral sections 210 of the frame 110. These sections may have an interior edge 230. The lateral sections 210 are generally made from the same material as the rest of the frame 110 and may contact the substrate either directly or indirectly, for example through an intermediate support 320.

FIG. 5 also provides examples of clamping mechanisms, 510. The clamping mechanism 510 holds the substrate in place while it undergoes PVD coating, and in some cases while the substrate is moved through the various process steps. The clamping mechanism can be any holder design that is sufficiently strong enough and stable enough to hold the large, relatively flexible glass in proper place while undergoing the process steps described herein. In some embodiments, the clamping mechanism comprises one or more of brackets, clips, adhesive, clamps, grooves, and the like. The clamping mechanism can have a polymer or rubber or other non-marring contact point that contacts the substrate to prevent damage to the substrate surface.

In addition to carrier design, there are non-geometric approaches to particle reduction that may be used separately or in combination. In particular, the adhesion of the deposited film to the metal surfaces may be enhanced to reduce or delay flaking and particle generation. One method for modifying adhesion is by controlling the roughness of carrier and/or frame surfaces, such as through sand blasting or mechanical abrasion. In some embodiments, it is advantageous to roughen the surface to a value of 500 nm to 100 µm, 1 µm to 100 µm, 500 nm to 50 µm, 1 µm to 75 µm, 1 µm to 50 µm, 1 µm to 25 µm, 1 µm to 10 µm, 500 nm to 10 µm, 500 nm to 5 µm, or 1 µm to 5 µm.

Adhesion can also be modified by using an intermediate coating. Coatings may comprise, for example, copper, chromium, titanium, nickel, or combinations or oxides thereof. Coatings can be applied by known means, such as electrolytic coating or twin-wire arc spray and could be deposited onto the carriers during routine maintenance.

While the embodiments described herein are directed to a substrate having a square or rectangular configuration, the apparatus and processes described are equally applicable to any substrate with any alternative shape. For example, the processes and apparatus described herein would be equally applicable to a round, triangular, or other geometric shaped substrate. Such embodiments may necessitate changes in the carrier 100, the frame 200, or sections of the frame, but otherwise should generally not need substantive modification.

Substrates that can be used in the applications described herein include any that survive the PVD processes. Primarily this comprises glass and glass ceramic substrates, but may also include some metals and high temperature polymers.

The carrier 100 described herein can be used in many processes where there is a need to coat substrates with little to no contamination by remnant particles. While it is particularly useful for PVD, it could also be used in coating processes such as chemical vapor deposition, sputtering deposition, electron beam deposition, pulsed laser deposition, molecular beam epitaxy, or ion beam deposition. Use of the carrier in these processes is relatively straightforward with the substrate being placed in the carrier, properly affixed, and then placed in the thin film coating device and subjected to coating. Depending on the coating process, it may be necessary to optimize the tilt angle of the substrate to minimize the amount of particulate contamination that accumulates on the substrate.

The invention claimed is:

1. An article comprising:
a carrier for holding a substrate in an approximately vertical configuration, the substrate having at least a front face, a back face, a top edge, a bottom edge, and two lateral edges, the carrier comprising: a. a frame that is dimensionally larger than the substrate, the frame comprising: i. a top section comprising at least one edge and positioned to contact, or indirectly or directly support at least part of the top edge, the front face or the back face of the substrate; A. wherein the top section comprises one or more collection trays, the one or more collection trays comprise a finned object having a length, a width, and a thickness, that protrudes from the top section at an angle θ of from about 20° to about 160° relative to the top section, and wherein the length of the finned object spans at least part of the length of the top section and is approximately parallel to the at least one edge of the top section; ii. a bottom section approximately parallel to the top section, the bottom section positioned to contact, or indirectly or directly support at least part of the bottom edge, the front face or the back face of the substrate; and iii. two lateral sections approximately parallel to each other and approximately orthogonal to the top and bottom sections, each lateral section positioned to contact, or indirectly or directly support at least part of one of the lateral edges, or the front face or the back face of the substrate; b. one or more clamping mechanisms for fixing a glass to at least one of the top, bottom, or lateral sections of the frame; and wherein the carrier is designed so that when a substrate is in the carrier, the substrate is held at an angle θ of from greater than 0° to about 10° forward tilt.

2. The article of claim 1, wherein the substrate is held at an angle (φ) of from greater than about 1° to about 5° forward tilt.

3. The article of claim 1, wherein the finned object protrudes from the top section at an angle θ of from about 40° to about 170° relative to the top section.

4. The article of claim 1, wherein the angle of the finned object relative to the top section changes from the initial angle θ to a final angle, ψ.

5. The article of claim 4, wherein the change in angle is due to a curve or a bend and is the difference between θ and ψ and is greater than 60°.

6. The article of claim 1, wherein the top section of the frame is in front of the front face of the substrate and has a tilt, ω, of from −10° to 10°.

7. The article of claim 1, wherein the top section of the frame is behind of the front face of the substrate and has a forward tilt, co, of from −10° to 10°.

8. The article of claim 1, wherein the frame further comprises one or more electrolytic coating layers.

9. The article of claim 8, wherein the electrolytic coating layer comprises copper, chromium, titanium, nickel, or combinations or oxides thereof.

10. The article of claim 1, wherein at least part of the carrier has an average surface roughness, Ra, of from 1 μm to 100 μm.

* * * * *

UNITED STATES PATENT AND TRADEMARK OFFICE
CERTIFICATE OF CORRECTION

PATENT NO. : 11,053,583 B2  
APPLICATION NO. : 16/348708  
DATED : July 6, 2021  
INVENTOR(S) : James Gregory Couillard et al.

It is certified that error appears in the above-identified patent and that said Letters Patent is hereby corrected as shown below:

In the Claims

In Column 11, Line 3, Claim 7, delete "co," and insert -- ω, --, therefor.

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*